(12) United States Patent
Tung

(10) Patent No.: US 8,739,083 B1
(45) Date of Patent: May 27, 2014

(54) LAYOUT DECOMPOSITION METHOD AND METHOD FOR MANUFACTURING SEMICONDUCTOR DEVICE APPLYING THE SAME

(71) Applicant: United Microelectronics Corp., Hsinchu (TW)

(72) Inventor: Yu-Cheng Tung, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/676,185

(22) Filed: Nov. 14, 2012

(51) Int. Cl.
*G06F 17/50* (2006.01)

(52) U.S. Cl.
USPC ............... 716/55; 716/50; 716/52; 716/53; 716/54; 716/56; 430/5; 430/30

(58) Field of Classification Search
USPC ..................... 716/50–56; 430/5, 30
See application file for complete search history.

(56) References Cited

U.S. PATENT DOCUMENTS

| | | |
|---|---|---|
| 6,492,073 B1 | 12/2002 | Lin et al. |
| 7,247,887 B2 | 7/2007 | King et al. |
| 7,617,476 B2 | 11/2009 | Hsu et al. |
| 8,209,656 B1* | 6/2012 | Wang et al. .................... 716/139 |
| 2007/0020565 A1 | 1/2007 | Koh et al. |
| 2007/0031740 A1* | 2/2007 | Chen et al. ......................... 430/5 |
| 2007/0158756 A1 | 7/2007 | Dreeskornfeld et al. |
| 2008/0092106 A1* | 4/2008 | Hsu et al. ......................... 716/20 |
| 2008/0201686 A1* | 8/2008 | Zhang .............................. 716/19 |
| 2008/0248429 A1 | 10/2008 | Chou et al. |
| 2009/0199137 A1* | 8/2009 | Huckabay et al. ................. 716/4 |
| 2009/0233238 A1 | 9/2009 | Hsu et al. |
| 2009/0258500 A1 | 10/2009 | Yang et al. |
| 2009/0319978 A1* | 12/2009 | Gleason et al. .................. 716/21 |
| 2011/0004858 A1* | 1/2011 | Chang et al. .................... 716/122 |
| 2011/0014786 A1 | 1/2011 | Sezginer et al. |
| 2011/0119648 A1* | 5/2011 | Chen et al. ..................... 716/126 |
| 2013/0024824 A1* | 1/2013 | Huang et al. .................... 716/53 |
| 2013/0159945 A1* | 6/2013 | Kahng et al. .................... 716/52 |

* cited by examiner

*Primary Examiner* — Nha Nguyen
(74) *Attorney, Agent, or Firm* — WPAT, PC; Justin King

(57) ABSTRACT

A layout decomposition method and a method for manufacturing a semiconductor device applying the same are provided. According to the layout decomposition method, a design layout is received by the logic processor of a computing system. A design rule for layout decomposition is then identified by the logic processor, including identifying the loose areas (areas with loosely distributed features) and dense areas (areas with densely distributed features) on a substrate, and identifying first areas with odd-numbered features and second areas with even-numbered features on the substrate. Next, a first mask with a first pattern and a second mask with a second pattern are generated corresponding to results of design rule identification by the computing system.

20 Claims, 5 Drawing Sheets

LAYOUT DECOMPOSITION METHOD AND METHOD FOR MANUFACTURING SEMICONDUCTOR DEVICE APPLYING THE SAME

BACKGROUND

1. Technical Field

The disclosure relates in general to a layout decomposition method and method for manufacturing a semiconductor device applying the same, and more particularly to the layout decomposition method involving identification of areas containing even-numbered features and odd-numbered features, and method for manufacturing the semiconductor device with even-numbered features and odd-numbered features after double exposure.

2. Description of the Related Art

With a continuing development of reduce-sized electrical devices, the features such as integrated circuits (ICs) thereon are being made smaller and smaller. The fine pitches and patterns of features are required to satisfy the demands of the smaller devices. However, the required fine pitches and patterns of features raise the difficulty of the device fabrication. The feature size reduction could be limited due to the conventional processing techniques; for example, photolithography techniques have a minimum pitch below which features cannot be formed reliably. Generally, the ability to project an accurate image of increasingly smaller features onto the substrate/wafer is limited by the wavelength of the light used in photolithography, and the ability of the lens system. The yield of the photolithographic process gradually decreases, and its cost increases, as k1, a dimensionless coefficient of process-related factor, decreases below 0.35. Reducing k1 below 0.28 for a single exposure is not practical. Typically, double exposure is adopted for forming the features containing fine patterns and large patterns on a device.

Also, the "pitch doubling" technique has been proposed for extending the capabilities of photolithographic techniques beyond their minimum pitch, and it allows the number of features in a region of the substrate to be doubled. However, the doubled features formed by the "pitch doubling" technique would cause the problem to the areas requiring forming the odd-numbered features.

SUMMARY

The disclosure is directed to a layout decomposition method and a method for manufacturing a semiconductor device applying the same. The layout decomposition method including step of identifying areas of even-numbered features and odd-numbered features. The method for manufacturing semiconductor device applying the layout decomposition method of the embodiment simply transfers the patterns the containing even-numbered features and odd-numbered features of the semiconductor device.

According to the disclosure, a layout decomposition method, executed by a logic processor of a computing system is provided. First, a design layout is received by the logic processor. A design rule for layout decomposition is then identified by the logic processor, including identifying the loose areas (areas with loosely distributed features) and dense areas (areas with densely distributed features) on a substrate, and identifying first areas with odd-numbered features and second areas with even-numbered features on the substrate. Next, a first mask with a first pattern and a second mask with a second pattern are generated corresponding to results of design rule identification by the computing system.

According to the disclosure, a method for manufacturing a semiconductor device, involving a layout decomposition executed by a logic processor of a computing system, is provided. First, a design layout r is received and analyzed by the logic processor. Then the loose areas (areas with loosely distributed features) and dense areas (areas with densely distributed features) on a substrate, and also the first areas with odd-numbered features and the second areas with even-numbered features on the substrate are identified by the logic processor. Next, a temporary layer on the substrate firstly exposed through a first mask having a first pattern substantially related to the dense areas of the substrate, and the temporary layer is developed to form placeholders on the substrate. Then, a spacer material is deposited over the placeholders on the substrate, and the spacer material is etched to at least form spacers in the dense areas of the substrate. Next, the placeholders are removed, to form at least the even-numbered features at the second areas of the dense areas on the substrate. The spacer material at the loose areas and the spacers are exposed secondly through a second mask having a second pattern at least related to the loose areas of the substrate. The spacer material is developed to form at least features in the loose areas, wherein the odd-numbered features in the first areas of the dense areas could be formed either after firstly or after secondly exposing and developing steps.

DETAILED DESCRIPTION

Figure 1:
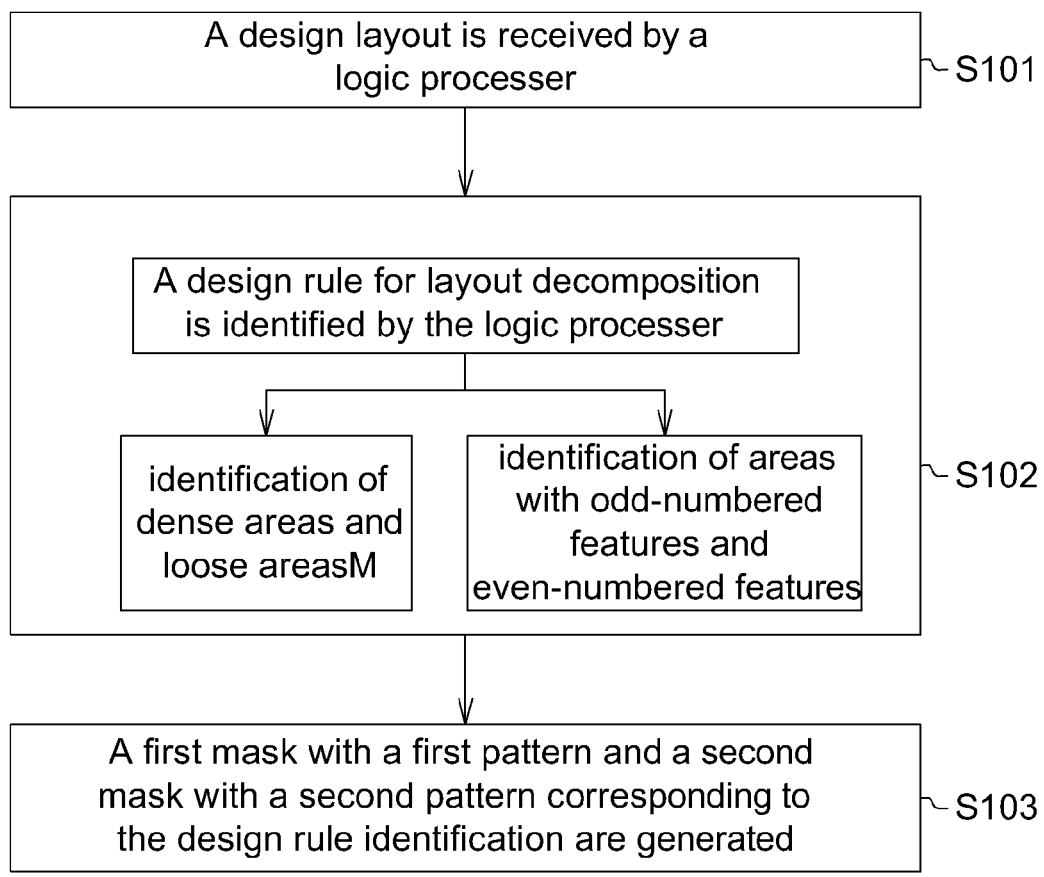
FIG. 1 shows a flowchart of a general process for a layout decomposition method according to the embodiment of the disclosure.

In the present disclosure, a layout decomposition method is provided, and could be applied to manufacture the semiconductor device with double exposure, so that the even-numbered features and odd-numbered features for transferring patterns on the device (e.g. on the substrate or layers deposited thereon) using pitch doubling technique are formed successfully. The embodiments are described in details with reference to the accompanying drawings. The identical elements of the embodiments are designated with the same reference numerals. It is also important to point out that the illustrations may not be necessarily be drawn to scale, and that there may be other embodiments of the present disclosure which are not specifically illustrated. Thus, the specification and the drawings are to be regard as an illustrative sense rather than a restrictive sense.

FIG. 1 shows a flowchart of a general process for a layout decomposition method according to the embodiment of the disclosure. The layout decomposition method of the disclosure is executed by a logic processer of a computing system. First, at step 101, a design layout is received by the logic processer. Next, at step 102, a design rule for layout decomposition is identified by the logic processer. In the embodiment, the identification of the design rule for layout decomposition includes the identification of areas with densely distributed features (i.e. "dense" areas) and areas with loosely distributed features (i.e. "loose" areas) of the device, and also the identification of patterned areas with odd-numbered features and even-numbered features. Then, at step 103, a first mask with a first pattern and a second mask with a second pattern corresponding to the results of design rule identification are created by the computing system.

In the application of the embodiment, the "dense" areas could be positioned in an array region which is typically densely populated with conductive lines and electrical components such as transistor and capacitors. The "loose" areas could be positioned in a peripheral region which optionally includes features larger than those in the array region. However, determinations of "dense" areas and "loose" areas, or "small" features and "large" features are chosen based on the process conditions for various pattern forming in the application, and can not be limited to the specific regions of the device. In the application of the embodiment, double exposure by the first mask followed by the second mask could be also adopted for making the device with patterns of fine and large features, odd-numbered and even-numbered features.

In the embodiments, at step 102, the minimum pitch of the features has been determined, and the areas with odd-numbered and even-numbered features have also been identified. Generally, the first pattern of the first mask contains the pattern of minimum pitch. There are several approaches to apply the layout decomposition method of the disclosure to manufacture the semiconductor device with odd-numbered features and even-numbered features, which are illustrated below.

Figure 2A:
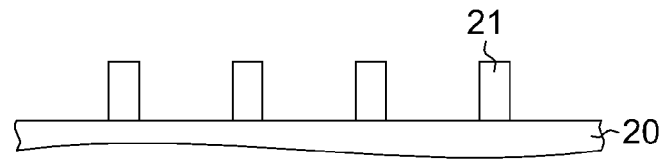
FIG. 2A~FIG. 2D schematically illustrate an example for partially manufacturing a device with even-numbered features on a dense area according to the embodiment of the disclosure.
Figure 2B:
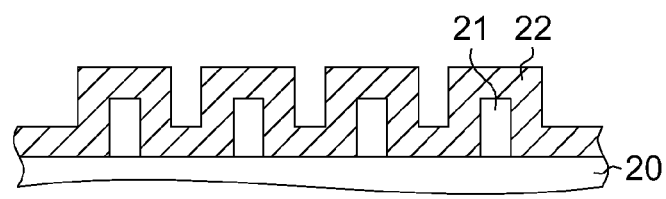
Figure 2C:
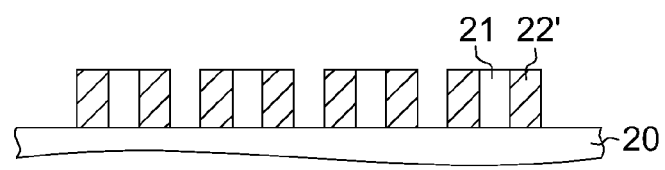
Figure 2D:
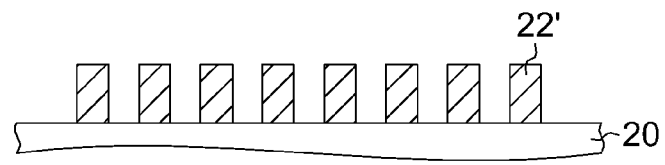

FIG. 2A~FIG. 2D schematically illustrate an example for partially manufacturing a device with even-numbered features on a dense area according to the embodiment of the disclosure. In this example, a first mask having a first pattern containing plural fine-striped regions related to the dense areas of the substrate 20 is generated, while a second mask having a second pattern related to the loose areas and cutting/shielding regions of the dense areas of the substrate 20 is generated after design layout identification. As shown in FIG. 2A, the placeholders 21 are formed on the substrate 20. A layer of spacer material 22 is then deposited over the placeholders 21, as shown in FIG. 2B. Spacers 22' are subsequently formed on the sides of the placeholders 21 by anisotropic etching, such as etching the spacer material 22 from the horizontal surfaces in a directional spacer etch, as shown in FIG. 2C. As shown in FIG. 2D, the placeholders 21 are then removed to leave the spacers 22' standing on the substrate 20. Accordingly, the number of the spacers 22' is twice of the placeholders 21. The spacers 22' act as a mask for transferring pattern of spacer 22' to the substrate 20, which forms the even-numbered features on the dense area of the device.

Figure 3A:
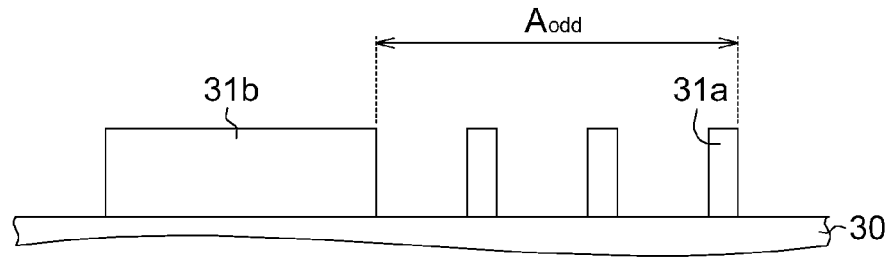
FIG. 3A~FIG. 3D schematically illustrate an approach for partially manufacturing a device with odd-numbered features on a dense area according to the embodiment of the disclosure.

FIG. 3A~FIG. 3D schematically illustrate an approach for partially manufacturing a device with odd-numbered features on a dense area according to the embodiment of the disclosure. In this example, a first mask (not shown) may have plural fine-striped regions and wide-striped regions that are organized into the first pattern associated with the result of design layout identification of dense areas. Also, a second mask (not shown) having a second pattern is generated after design layout identification, which the second pattern is substantially corresponding to the loose areas on the substrate 30, and maybe related to the cutting/shielding regions of the dense areas based on the design needs. In this embodiment, the fine-striped regions of the first mask corresponding to the dense area (Aodd) with odd-numbered features define the fine placeholders 31a on the substrate 30. Also, one of the wide-striped regions of the first mask is adjacent to one of the fine-striped regions in correspondence to one of the dense areas (Aodd), which defines at least a wide placeholder 31b adjacent to the fine placeholders 31a on the substrate 30, as shown in FIG. 3A.

Figure 3B:
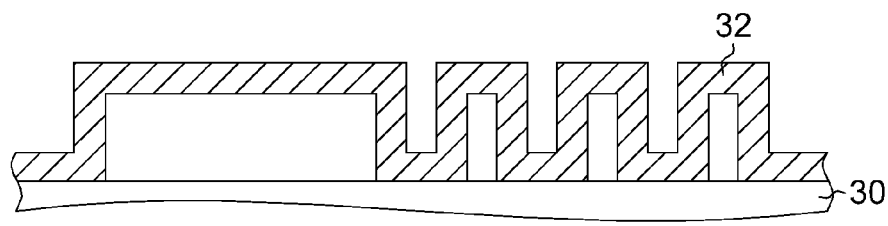
Figure 3C:
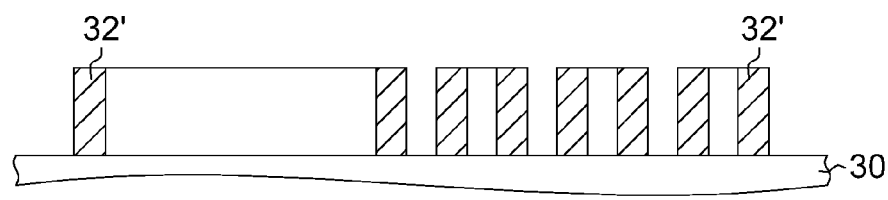
Figure 3D:
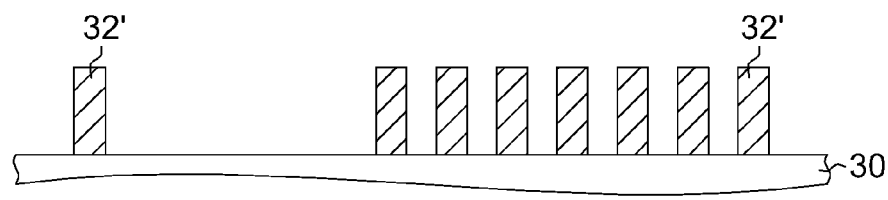

Similarly, a layer of spacer material 32 is then deposited over the fine placeholders 31a and wide placeholder 31b, as shown in FIG. 3B. Spacers 32' are subsequently formed on the sides of the fine placeholders 31a and wide placeholder 31b by anisotropic etching, such as etching the spacer material 32 from the horizontal surfaces in a directional spacer etch, as shown in FIG. 3C. The spacers 32' at two sides of the wide placeholder 31b belong to different areas, such as belonging to an area with odd-numbered features (Aodd) and another area with odd-numbered features. As shown in FIG. 3D, the fine placeholders 31a and wide placeholder 31b are then removed to leave the spacers 32' standing on the substrate 30. Accordingly, odd-numbered spacers 32' are formed in the dense area (Aodd) with odd-numbered features. The spacer 32' standing outside the dense area (Aodd) with odd-numbered features could be grouped with other spacer or treated with dummy spacer, and the disclosure has no limitation thereto. In subsequent process, the spacers 32' act as a mask for transferring pattern of spacer 32' to the substrate 30. Since the odd-numbered spacers 32' are formed as described above, the odd-numbered features would be successfully formed in the dense area of the device.

Figure 4A:
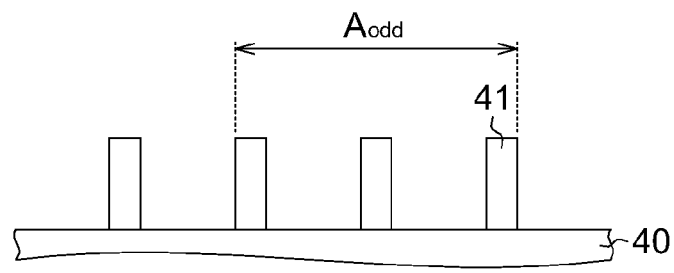
FIG. 4A~FIG. 4D schematically illustrate another approach for partially manufacturing a device with odd-numbered features on a dense area according to the embodiment of the disclosure.
Figure 4B:
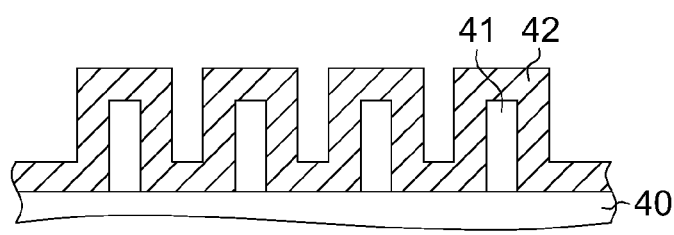
Figure 4C:
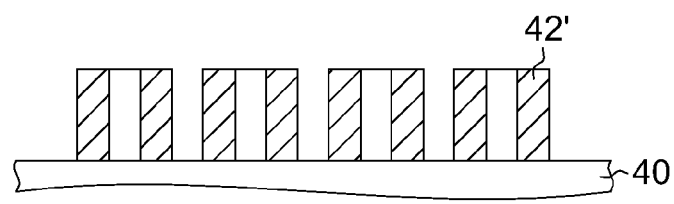
Figure 4D:
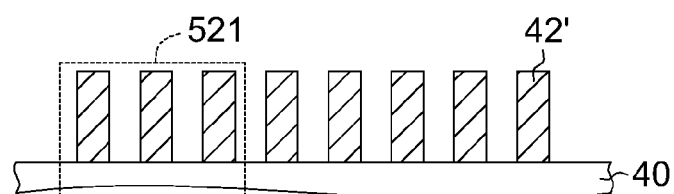
Figure 5:
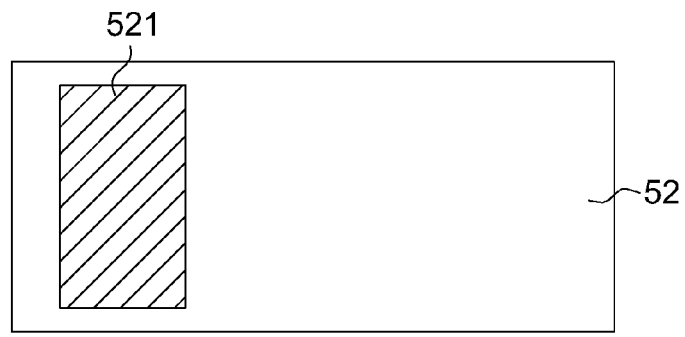
FIG. 5 illustrates a second mask for transferring pattern of spacers to the substrate.

FIG. 4A~FIG. 4D schematically illustrate another approach for partially manufacturing a device with odd-numbered features on a dense area according to the embodiment of the disclosure. Formations of the placeholders 41, spacer material 42 and spacers 42' on the substrate 40 are similar to that of the placeholders 21, spacer material 22 and spacers 22' as described in FIG. 2A~FIG. 2D, which are not redundantly repeated. In this approach, the first pattern of the first mask including plural fine-striped regions corresponding to the dense areas is generated after design layout identification, while the second pattern of the second mask including correction regions related to the dense areas and normal regions related to the loose areas is generated after design layout identification. In one example, the correction regions of the second mask include opaque regions and transmissive regions, respectively for shielding and cutting spacers 42' formed on the substrate 40. As shown in FIG. 4A, the fine-striped regions of the first mask define the fine placeholders 41 on the substrate 40, and part of the fine placeholders 41 corresponds to the dense area (Aodd) with odd-numbered features. As shown in FIG. 4C and FIG. 4D, even-numbered spacers 42' are formed on the substrate 40. In the subsequent pattern-transferring process, the opaque region 521 of the second mask is used for shielding odd-numbered spacers 42', so that the remaining odd-numbered spacers 42' act as a mask for transferring pattern to the dense area of the substrate 40. Since the odd-numbered spacers 42' are remained for pattern-transfer, the odd-numbered features are successfully formed in the dense area (Aodd) of the device. Please also refer to FIG. 5, which illustrates a second mask 52 with the opaque region 521 adopted for transferring pattern of spacers 42' to the substrate 40.

Figure 6A:
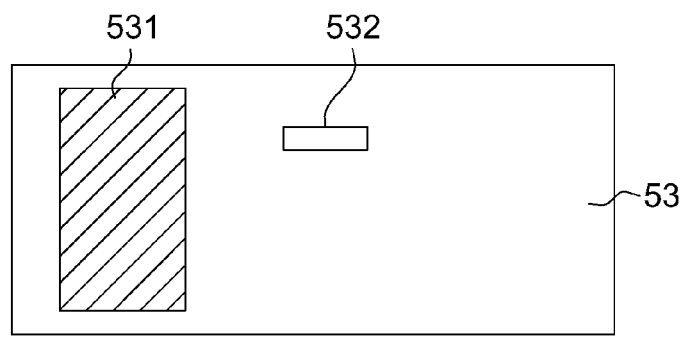
FIG. 6A illustrates another second mask adopted for subsequently transferring pattern of spacers of FIG. 4D.
Figure 6B:
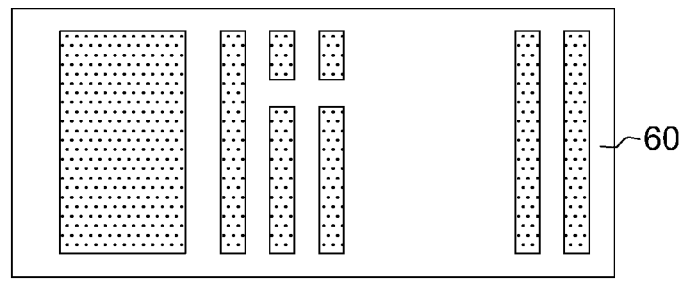
FIG. 6B illustrates a patterned substrate after spacer pattern transformation.

FIG. 6A illustrates another second mask adopted for subsequently transferring pattern of spacers of FIG. 4D. Besides the opaque region 531 for shielding, the correction regions of the second mask 53 may further include pattern (such as at least one transmissive region 532) for cutting the spacer-transfer pattern formed on the substrate to meet the design requirements. Please refer to FIG. 6B, which is a top view of a patterned substrate 60 after spacer pattern transformation.

According to the approaches described above, after design layout identification, a first mask having pattern related to the dense areas of the substrate is generated; while a second mask having pattern related to the loose areas, and/or to the cutting/shielding regions of the dense areas of the substrate if required by the design layout, is generated. The first mask is applied firstly to fabricate the patterns of spacers with small pitches (e.g. minimum pitch) in the dense areas of the substrate. Then, the second mask is applied to fabricate the patterns in the loose area, and also slot cuts or shields part of the spacers in the dense areas, thereby defining patterns containing the odd-numbered features and/or even-numbered features at the corresponding areas identified according to the design rule.

However, the disclosure is not limited thereto, and the pattern transferring process could be modified for pattern fabrication. In another example, a first mask having a first pattern corresponding to the entire substrate is generated after design layout identification, wherein the first pattern includes plural fine-striped regions corresponding to the minimum pitch of the dense areas. Also, a second mask having pattern related to the loose areas and cutting/shielding regions of the dense areas of the substrate is generated after design layout identification. For example, the second pattern of the second mask includes first correction regions related to the dense areas and second correction regions related to the loose areas. The first mask is applied firstly to fabricate the entire substrate containing the patterns of spacers with small pitches (as required in the dense areas). Then, the second mask is applied to cut the unwanted densely distributed spacers in the loose area, and the second mask also slot cuts or shields part of the dense areas to define the odd-numbered and even-numbered features. For example, the first correction regions of the second mask may include first opaque regions and/or first transmissive regions, for shielding and/or cutting the spacers formed on the dense areas of the substrate, respectively. The second correction regions of the second mask may include second opaque regions and/or second transmissive regions for shielding and/or removing undesired spacers in the loose areas of the substrate.

In the exemplified embodiments, the placeholders 21, 31a, 31b and 41 could be one layer or multi-layer of hard mask, which may comprise a material such as silicon nitride, silicon oxide, polycrystalline silicon, an organic material such as an amorphous carbon material, a polymer material, a spin on dielectric material such as an organic spin on anti-reflective coating ("ARC"), a dielectric anti-reflective coating ("DARC") such as silicon-rich silicon oxynitride, or an inorganic material. In general, the materials for the placeholders 21, 31a, 31b and 41, and the spacer material 22, 32 and 42 are chosen based on the chemistry and the process conditions for the various patterns forming and transfer steps disclosed herein. Preferably, the material of the placeholders 21, 31a, 31b and 41 can be selectively etched (or "preferentially etched") with respect to subsequently-deposited spacer material 22, 32 and 42. Also, the thicknesses of the placeholders 21, 31a, 31b and 41, and the spacers 22', 32' and 42' are also chosen depending upon compatibility with the etch chemistries and process conditions disclosed herein. Additionally, although a patterning process on the substrate is taken for illustration in the embodiments, other layer(s) could be added on the substrate and pattern could be transferred to the layer(s) if suitable materials, chemistries and/or process conditions are used.

Accordingly to the layout decomposition method of the disclosure, the masks with particular patterns could be generated, and the even-numbered features and odd-numbered features can be successfully and simply formed on the device (e.g. on the substrate or layers deposited thereon) without additional complicated processing steps. Also, the manufacturing method applied with the layout decomposition method of the embodiment is compatible with current process. Thus, the layout decomposition method of the embodiment is feasible for mass production.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A layout decomposition method, executed by a logic processer of a computing system, comprising:
 receiving a design layout by the logic processer;
 identifying a design rule for layout decomposition by the logic processer, comprising:
  identifying a plurality of loose areas and dense areas on a substrate; and
  identifying first areas with odd-numbered features and second areas with even-numbered features on the substrate; and
 generating masks for forming the odd-numbered features in the first areas of the dense areas according to results of design rule identification by the computing system, wherein the masks comprising one set selected from the groups including:
  a first mask having a first pattern for fabricating, in the dense areas, patterns of spacers with pitches required in the dense areas, and a second mask having a second pattern for fabricating patterns in the loose areas and optional for cutting and/or shielding parts of the spacers in the dense areas; and
  a first mask having a first pattern for fabricating, on the entire substrate, patterns of spacers with pitches required in the dense areas, and a second mask having a second pattern for cutting the spacers in the loose areas and for cutting and/or shielding parts of the spacers in the dense areas.

2. The layout decomposition method according to claim 1, wherein the masks comprise the first mask having the first pattern for fabricating the patterns of the spacers in the dense areas.

3. The layout decomposition method according to claim 2, wherein the first mask includes fine-striped regions and wide-striped regions that are organized into the first pattern that defines placeholders on the substrate.

4. The layout decomposition method according to claim 3, wherein one of the wide-striped regions is adjacent to one of the fine-striped regions in correspondence to one of the dense areas, which defines at least a wide placeholder adjacent to plural fine placeholders on the substrate.

5. The layout decomposition method according to claim 3, wherein the second pattern of the second mask is substantially corresponding to the loose areas.

6. The layout decomposition method according to claim 1, wherein the masks comprise the first mask having the first pattern for fabricating the patterns of the spacers in the dense areas, and the first pattern of the first mask includes fine-striped regions corresponding to the dense areas.

7. The layout decomposition method according to claim 6, wherein the second pattern of the second mask includes correction regions related to the dense areas and normal regions related to the loose areas.

8. The layout decomposition method according to claim 7, wherein the correction regions of the second mask includes opaque regions and transmissive regions, respectively for shielding and cutting spacers formed on substrate.

9. The layout decomposition method according to claim 1, wherein the masks comprise the first mask having the first pattern for fabricating the patterns of the spacers on the entire substrate, and the first pattern includes fine-striped regions corresponding to a minimum pitch of the dense areas.

10. The layout decomposition method according to claim 9, wherein the second pattern of the second mask includes first correction regions related to the dense areas and second correction regions related to the loose areas.

11. The layout decomposition method according to claim 10, wherein the first correction regions of the second mask include first opaque regions and first transmissive regions, respectively for shielding and cutting spacers formed on the dense areas of the substrate.

12. The layout decomposition method according to claim 10, wherein the second correction regions of the second mask include second opaque regions or second transmissive regions or combination thereof, for shielding or removing undesired spacers formed on the loose areas of the substrate.

13. A method for manufacturing a semiconductor device, involving a layout decomposition executed by a logic processer of a computing system, comprising:
receiving and analyzing a design layout by the logic processer;
identifying a plurality of loose areas and dense areas and identifying a plurality of first areas with odd-numbered features and second areas with even-numbered features on a substrate of the semiconductor device according to analyzing results of the design layout by the logic processer;
firstly exposing a temporary layer on the substrate through a first mask having a first pattern for fabricating patterns of spacers at least in the identified dense areas of the substrate;
developing the temporary layer to form placeholders on the substrate;
deposited a spacer material over the placeholders on the substrate, and patterning the spacer material to at least form the spacers in the dense areas of the substrate;
removing the placeholders to form at least the even-numbered features at the second areas of the dense areas on the substrate;
secondly exposing the spacer material at the loose areas and the spacers at the dense areas on the substrate through a second mask having a second pattern for fabricating patterns in the identified loose areas and optional for cutting and/or shielding parts of the spacers in the identified dense areas; and
developing the spacer material to at least form features in the loose areas, wherein the odd-numbered features in the first areas of the dense areas are formed after firstly or secondly exposing and developing steps.

14. The method according to claim 13, wherein the first mask includes plural fine-striped regions and plural wide-striped regions that are organized into the first pattern, and the odd-numbered features in the first areas and the even-numbered features in the second areas are simultaneously formed in the dense areas of the substrate after firstly exposing and developing step using the first mask and removing the placeholders.

15. The method according to claim 13, wherein the first mask includes plural fine-striped regions substantially related to the dense areas of the substrate, and the spacers substantially formed at the dense areas after exposing and developing the temporary layer using the first mask.

16. The method according to claim 15, wherein the second mask includes correction regions related to the dense areas and normal regions related to the loose areas, and the correction regions includes opaque regions and transmissive regions related to plural cutting regions and shielding regions of the dense areas, the odd-numbered features in the first areas of the dense areas and features in the loose areas are formed after exposing and developing the spacers and the spacer material using the second mask.

17. The method according to claim 13, wherein the first pattern of the first mask corresponds to the entire substrate and includes fine-striped regions corresponding to the dense areas, at least the even-numbered spacers in the second areas of the dense areas are formed after firstly exposing and developing step using the first mask and removing the placeholders.

18. The method according to claim 17, wherein the second pattern of the second mask includes first correction regions related to the dense areas and second correction regions related to the loose areas, the odd-numbered features in the first areas of the dense areas and features in the loose areas are formed after exposing and developing the spacers and the spacer material using the second mask.

19. The method according to claim 18, wherein the first correction regions of the second mask include first opaque regions and first transmissive regions, respectively for shielding and cutting the spacers formed on the dense areas of the substrate.

20. The layout decomposition method according to claim 19, wherein the second correction regions of the second mask include second opaque regions or second transmissive regions or combination thereof, for shielding or removing undesired parts of the spacer material formed on the loose areas of the substrate, so as to form the features in the loose areas of the substrate.

* * * * *